(12) United States Patent
Yamasaki et al.

(10) Patent No.: US 11,164,899 B2
(45) Date of Patent: Nov. 2, 2021

(54) IMAGING DEVICE

(71) Applicant: CANON KABUSHIKI KAISHA, Tokyo (JP)

(72) Inventors: Takahiro Yamasaki, Tachikawa (JP); Atsushi Furubayashi, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 32 days.

(21) Appl. No.: 16/377,361

(22) Filed: Apr. 8, 2019

(65) Prior Publication Data
US 2019/0312071 A1    Oct. 10, 2019

(30) Foreign Application Priority Data

Apr. 10, 2018   (JP) .............................. JP2018-075187

(51) Int. Cl.
*H01L 27/146*   (2006.01)
*H04N 5/341*    (2011.01)

(52) U.S. Cl.
CPC .. *H01L 27/14612* (2013.01); *H01L 27/14603* (2013.01); *H01L 27/14636* (2013.01); *H01L 27/14649* (2013.01); *H04N 5/341* (2013.01)

(58) Field of Classification Search
CPC ......... H01L 27/14603; H01L 27/14612; H01L 27/14665; H01L 27/14667; H01L 27/14669; H01L 27/14636; H01L 27/14649; H04N 5/341
See application file for complete search history.

(56) References Cited

U.S. PATENT DOCUMENTS

| 9,900,539 B2 | 2/2018 | Yamasaki et al. |
| 10,033,953 B2 | 7/2018 | Minowa et al. |
| 2008/0174685 A1* | 7/2008 | Shan ...................... H04N 3/155 348/308 |

(Continued)

FOREIGN PATENT DOCUMENTS

| JP | 2008-227092 A | 9/2008 |
| JP | 2011-103335 A | 5/2011 |

(Continued)

OTHER PUBLICATIONS

U.S. Appl. No. 16/288,783, filed Feb. 28, 2019 (First Named Inventor: Hajime Ikeda).

*Primary Examiner* — Monica D Harrison
*Assistant Examiner* — John Lin
(74) *Attorney, Agent, or Firm* — Venable LLP

(57) ABSTRACT

An imaging device is used that has: a substrate; a first electrode layer disposed on the substrate, and having a first electrode; a first photoelectric conversion film disposed on the first electrode layer; a pixel electrode layer disposed on the first photoelectric conversion film, and having a pixel electrode; a second photoelectric conversion film disposed on the pixel electrode layer; and a second electrode layer disposed on the second photoelectric conversion film, and having a second electrode, wherein at least part of a period from among a first accumulation period during which a signal of the first photoelectric conversion film is accumulated, and a second accumulation period during which a signal of the second photoelectric conversion film is accumulated, does not overlap the other from among the first accumulation period and the second accumulation period.

23 Claims, 14 Drawing Sheets

(56) References Cited

U.S. PATENT DOCUMENTS

| | | |
|---|---|---|
| 2011/0109776 A1 | 5/2011 | Kawai |
| 2011/0298023 A1 | 12/2011 | Ohguro |
| 2013/0027574 A1* | 1/2013 | Solhusvik .......... H01L 27/14618 348/222.1 |
| 2015/0287766 A1* | 10/2015 | Kim ................... H01L 27/14641 250/208.1 |
| 2015/0334329 A1* | 11/2015 | Kato ................. H01L 27/14641 348/308 |
| 2018/0190697 A1* | 7/2018 | Lee ....................... H01L 31/062 |

FOREIGN PATENT DOCUMENTS

| | | |
|---|---|---|
| JP | 2011-258666 A | 12/2011 |
| JP | 2013-055252 A | 3/2013 |

\* cited by examiner

IMAGING DEVICE

BACKGROUND OF THE INVENTION

Field of the Invention

The present invention relates to an imaging device.

Description of the Related Art

A demand exists, in various industrial fields, for wider light absorption wavelength bands in solid-state imaging devices that utilize photoelectric conversion films. Techniques that involve combining photoelectric conversion films having different absorption wavelength bands are one means to that end. For instance, Japanese Patent Application Laid-open No. 2008-227092 discloses an imaging element in which photoelectric conversion films having mutually different absorption wavelength bands are laid up between an upper electrode and a lower electrode. Light carriers generated by the two photoelectric conversion films are read as a combined signal, to thereby widen an effective absorption wavelength band.

Patent Literature 1: Japanese Patent Application Laid-open No. 2008-227092

SUMMARY OF THE INVENTION

The present invention provides an imaging device, comprising:

a substrate;

a first electrode layer disposed on the substrate, and comprising a first electrode;

a first photoelectric conversion film disposed on the first electrode layer;

a pixel electrode layer disposed on the first photoelectric conversion film, and comprising a pixel electrode;

a second photoelectric conversion film disposed on the pixel electrode layer; and a second electrode layer disposed on the second photoelectric conversion film, and comprising a second electrode;

wherein at least part of one period from among a first accumulation period during which a signal of the first photoelectric conversion film is accumulated, and a second accumulation period during which a signal of the second photoelectric conversion film is accumulated, does not overlap the other period from among the first accumulation period and the second accumulation period.

The present invention also provides an imaging device, comprising:

a substrate;

a first electrode layer disposed on the substrate, and comprising a first electrode;

a first photoelectric conversion film disposed on the first electrode layer;

a pixel electrode layer disposed on the first photoelectric conversion film, and comprising a pixel electrode;

a second photoelectric conversion film disposed on the pixel electrode layer; and a second electrode layer disposed on the second photoelectric conversion film, and comprising a second electrode;

wherein one period from among a first accumulation period during which a signal of the first photoelectric conversion film is accumulated, and a second accumulation period during which a signal of the second photoelectric conversion film is accumulated, is longer than the other period.

Further features of the present invention will become apparent from the following description of exemplary embodiments with reference to the attached drawings.

DESCRIPTION OF THE EMBODIMENTS

There is a need for individually reading signals that are generated by respective stacked photoelectric conversion films. In the imaging element of Japanese Patent Application Laid-open No. 2008-227092, however, it is difficult to separate and read the signals generated by the respective photoelectric conversion films.

The technology described below relates to an imaging device that utilizes a plurality of stacked photoelectric conversion films, such that respective signals generated by the plurality of photoelectric conversion films can be read individually.

Preferred embodiments of the present invention will be explained next with reference to accompanying drawings. The dimensions, materials, shapes and relative arrangement of the constituent components described below are to be modified as appropriate depending on the configuration and attendant conditions of the device in which the invention is to be adopted. Accordingly, the scope of the present invention is not meant to be limited to the disclosure that follows below.

First Embodiment

Configuration

Figure 1:
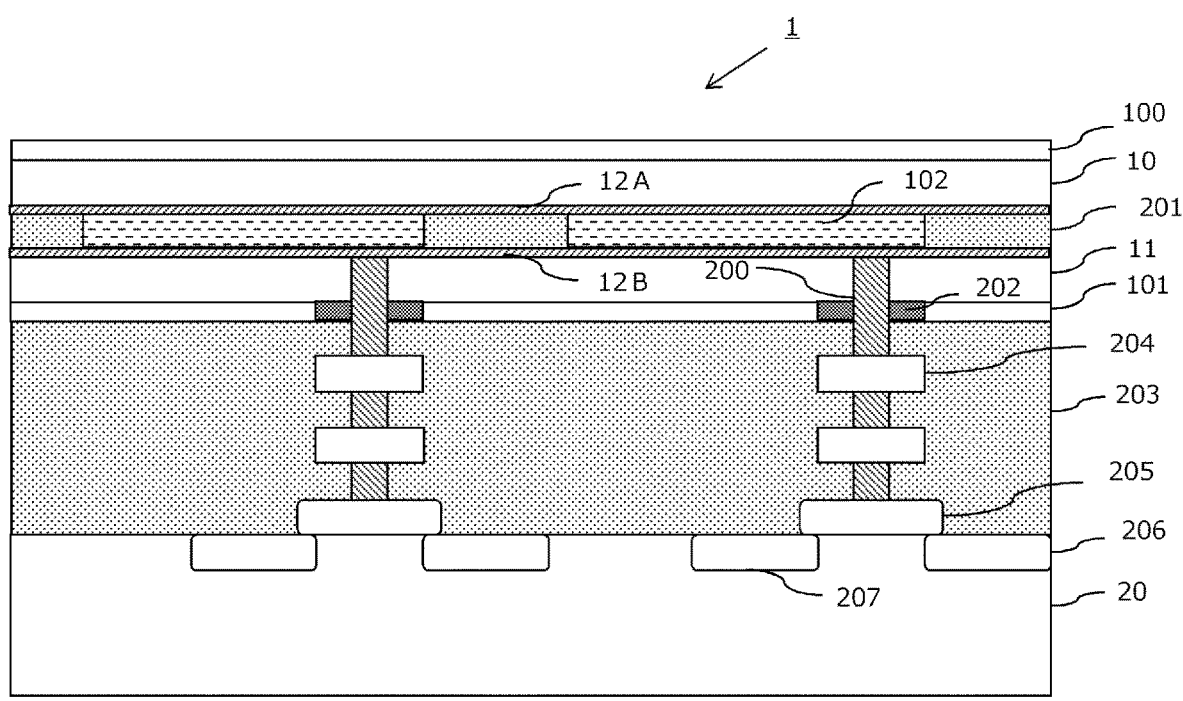
FIG. 1 is a cross-sectional structure diagram of an imaging device in a first embodiment.

FIG. 1 illustrates a partial cross-sectional structure of a solid-state imaging element of the present embodiment. FIG. 1 illustrates a cross-sectional structure pertaining to photoelectric conversion films of two pixels. The solid-state imaging element 1 has a multilayer structure in which for instance semiconductor materials are utilized. The solid-state imaging element 1 of the present embodiment has a structure in which an upper electrode 100, an upper photoelectric conversion film 10, an upper hole blocking layer 12A, a pixel electrode layer, a lower hole blocking layer 12B, a lower photoelectric conversion film 11, a lower electrode 101, a wiring layer and a silicon substrate 20 and sequentially laid up from above. The terms "upper" and "lower" are merely used for convenience. The pixel electrode layer has pixel electrodes 102 and a pixel electrode insulating film 201. The wiring layer has wiring 204 and interlayer film 203. Respective contact vias 200 are conductive members running through the lower electrode 101 and the lower photoelectric conversion film 11, and which connect the wiring to the pixel electrodes 102.

Typically, a dielectric film is further formed on top of the upper electrode 100, for instance for surface protection and anti-reflection purposes. A color filter array is further formed on the upper electrode 100, and a microlens array is further formed on the color filter array. Each microlens corresponds to one pixel of a pixel array. Light that is incident from a main surface side of the imaging device passes through the microlenses, the color filter, the dielectric film and the upper electrode, and reaches the upper photoelectric conversion film 10, thereby giving rise to photoelectric conversion and generation of signal charge. Light that reaches the lower photoelectric conversion film 11 gives similarly rise to a photoelectric conversion signal. In the semiconductor substrate, pad electrodes for electrical connection of the imaging device to an external circuit, as well as ancillary wiring to that end, are formed outside the pixel region in which the photoelectric conversion films and so forth are disposed.

The upper photoelectric conversion film 10 and the lower photoelectric conversion film 11 will be collectively referred to hereafter as "photoelectric conversion films", and the upper hole blocking layer 12A and the lower hole blocking layer 12B will be collectively referred to hereafter as "hole blocking layers", unless a particular need arises for distinguishing between the foregoing. The upper hole blocking layer 12A and the lower hole blocking layer 12B may be of the same material or of different materials. The two photoelectric conversion films may be of the same material or of different materials. The two hole blocking layers may be of the same material or of different materials. However, the polarities of the signal charges outputted to the pixel electrodes from both photoelectric conversion films are mutually identical. In a case where the materials of one of the photoelectric conversion films and of the other photoelectric conversion film are different from each other, for instance crystalline selenium having a main absorption characteristic in the visible region may be used as the upper photoelectric conversion film 10, and a layer containing quantum dots (for instance PdS) having a main absorption characteristic in the infrared region can be used as the lower photoelectric conversion film 11. In a case where the upper photoelectric conversion film 10 and the lower photoelectric conversion film 11 have different light absorption characteristics, the main element of the upper photoelectric conversion film 10 and the main element of the lower photoelectric conversion film 11 are set to be different from each other. As a result it becomes possible to read independently signals of different wavelength bands. The upper photoelectric conversion film corresponds to the second photoelectric conversion film of the present invention, and the lower photoelectric conversion film corresponds to the first photoelectric conversion film of the present invention. The upper electrode and the upper electrode layer having the upper electrode correspond respectively to the second electrode and second electrode layer of the present invention. The lower electrode and the lower electrode layer having the lower electrode correspond respectively to the first electrode and the first electrode layer of the present invention.

Figure 2A:
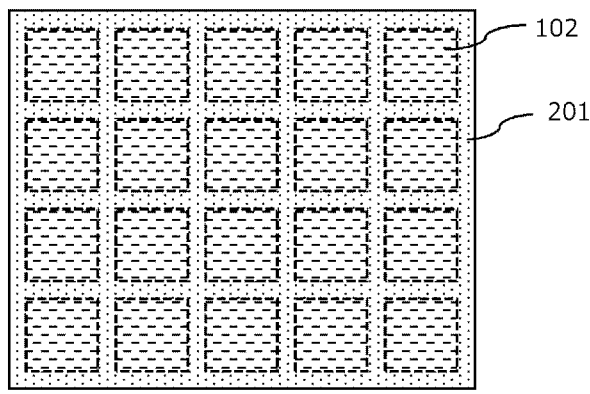
FIGS. 2A to 2C are plan-view diagrams of layers of the imaging device of the first embodiment, and a schematic diagram of an imaging system.

The upper photoelectric conversion film 10 and the lower photoelectric conversion film 11 are laid vertically on each other. These two photoelectric conversion films are sandwiched between the upper electrode 100 and the lower electrode 101. The pixel electrodes 102 are electrically isolated from each other, by the pixel electrode insulating film 201, in the pixel electrode layer disposed between the photoelectric conversion films. FIG. 2A is an example of a plan-view diagram of a pixel electrode layer. The pixel electrodes 102 are disposed in an array state, with the pixel electrode insulating film 201 between the pixel electrodes 102.

The photoelectric conversion films may each be a single-layer film or a multilayer film. A semiconductor material, a compound semiconductor or an organic semiconductor can be used as the material that makes up the photoelectric conversion films. Examples of the semiconductor material include inorganic semiconductor materials, amorphous silicon, oxides and selenium-containing materials. Inorganic semiconductor materials include for instance silicon, germanium and gallium arsenide. Amorphous silicon includes for instance true amorphous silicon, low-concentration p-type amorphous silicon and low-concentration n-type amorphous silicon. Oxides include for instance ZnO, $TiO_2$ and $Ga_2O_3$. Selenium-containing materials include for instance amorphous selenium and crystalline selenium.

Examples of compound semiconductors include group III-VI compound semiconductors such as BN, GaAs, GaP, AlSb and GaAlAsP, and group II-IV compound semiconductors such as CdSe, ZnS and HdTe.

Examples of organic semiconductors include for instance fullerenes, coumarin 6 (C6), rhodamine 6G (R6G), quinacridone, phthalocyanine-based materials such as zinc phthalocyanine (ZnPc), and naphthalocyanine-based materials.

A layer having quantum dots made up of the above-described semiconductor material can be used as each photoelectric conversion film. Amorphous silicon films, organic semiconductor films and quantum dot films can be easily made into thin films. The term quantum dots denotes herein particles having a particle size of 20.0 nm or less.

Intrinsic semiconductors have low carrier density. Accordingly, a large depletion layer width can be realized by using an intrinsic semiconductor in the photoelectric conversion films. As a result, this allows realizing photoelectric conversion films which have higher sensitivity and can achieve reduced noise reduction.

The upper hole blocking layer 12A and the lower hole blocking layer 12B have a potential barrier so as to hinder movement of holes from the photoelectric conversion films to the pixel electrodes. As a result it becomes possible to reduce holes generated thermally in the photoelectric conversion films, and to reduce dark current. The hole blocking layers have also the effect of curtailing forward current flowing from the upper electrode 100 and the lower electrode 101 to the pixel electrodes 102.

The hole blocking layers are preferably formed of a semiconductor material. The semiconductor material can be selected from among inorganic semiconductor materials such as silicon, germanium and gallium arsenide, and organic semiconductor materials. The semiconductor material that forms the photoelectric conversion films and the semiconductor material that forms the hole blocking layers may be different from each other. In a case where the materials are different, a heterojunction becomes formed between each photoelectric conversion layer and a respective hole blocking layer. Energy barriers are generated as a result between the photoelectric conversion layers and the hole blocking layers. Such energy barrier prevents intrusion of reverse polarity of signal charge from the photoelectric conversion layers into the pixel electrodes. As a result only signal charge is outputted from the pixel electrodes, and accordingly there can be reduced overlaying of noise on the output signal, derived from the output of reverse polarity charge.

The above explanation concerns an instance where the signal charge is holes, but the signal charge may be electrons. To produce the imaging device, the material of the hole blocking layers or electron blocking layers is selected depending on the type of the signal charge.

The band gap of the semiconductor material that forms the photoelectric conversion films and the band gap of the semiconductor material that forms the hole blocking layers may be different from each other. The term band gap denotes herein a difference between the lowest energy level of a conduction band and the highest energy level of a valence band. The material of the hole blocking layers is not limited to semiconductor materials.

The photoelectric conversion films and the hole blocking layers may be formed out of the same semiconductor material. In this case it suffices that the concentrations of impurities that are added to the photoelectric conversion films and the hole blocking layers be different from each other. The photoelectric conversion layers and the hole blocking layers would exhibit different then band gaps by virtue of the fact that the photoelectric conversion layers and the hole blocking layers are formed in this manner. As a result, an energy barrier is generated between each photoelectric conversion layer and a respective hole blocking layer, and charge of reverse polarity to that of the signal charge is prevented from being outputted from the pixel electrodes.

Figure 2B:
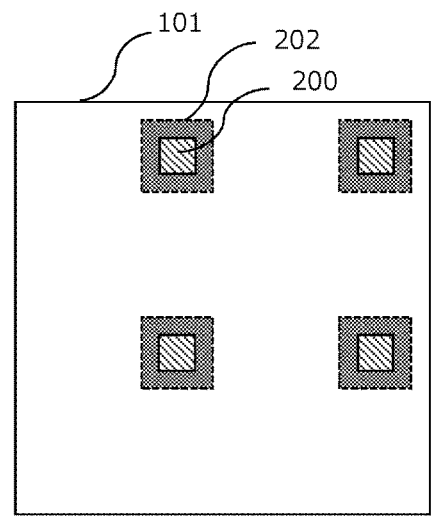

Each pixel electrode 102 is connected, by a respective contact via 200 and the wiring 204, to a gate 205 of a transistor that is formed on the silicon substrate 20. The gate 205 controls the current of a source 206 and a drain 207. The contact via 200 is electrically isolated from the lower electrode 101 by a contact via insulating film 202. FIG. 2B is an example of a plan-view diagram of the layer at which the lower electrode 101 is disposed. A respective contact via formation region, in which the contact via insulating film 202 is disposed of the periphery of each contact via 200, is formed in part of the lower electrode 101.

Figure 2C:
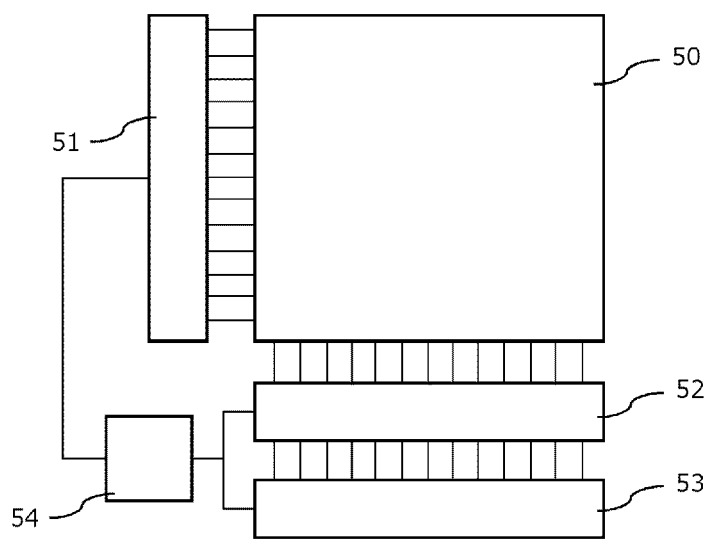

FIG. 2C illustrates an example of a schematic configuration of an imaging system provided with an imaging device of the present invention. The imaging system is provided with a pixel array 50, a vertical selection circuit 51, a signal processing circuit 52, a horizontal selection circuit 53 and a control circuit 54. A plurality of pixels is disposed in the form of a matrix in the pixel array 50. One pixel corresponds typically to one pixel electrode 102. The vertical selection circuit 51 selects rows in the pixel array 50. Thereupon, respective pixel signals are outputted, via a vertical output line, from the pixels included in that row. The vertical output line may be provided for each single column, or may be provided for a plurality of columns.

The signal processing circuit 52 receives the pixel signals outputted from the pixel array 50, and performs, on the received pixel signals, processing such as amplification, AD conversion and noise reduction. The signal processing circuit 52 is for instance provided with an amplifier circuit, an AD conversion circuit and a memory. The horizontal selection circuit 53 selects sequentially signals processed by the signal processing circuit 52, and outputs the signals to the exterior via a horizontal output line (not shown). The control circuit 54 transmits a control signal, via a control line, to each block included in the imaging device. The control circuit 54 is for instance provided with a timing generator that generates a timing signal and a control pulse.

Figure 3:
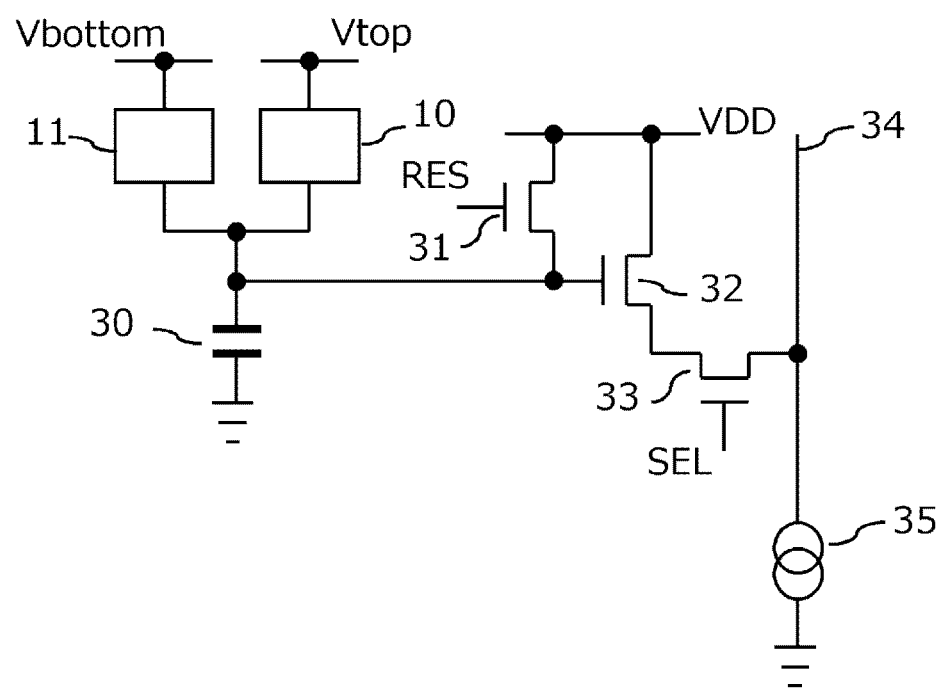
FIG. 3 is a circuit diagram of the imaging device of the first embodiment.

FIG. 3 is an equivalent circuit diagram of one pixel in the present embodiment. In the present embodiment, the pixel illustrated in FIG. 3 is disposed, over a plurality of rows and a plurality of columns, on the pixel array 50 illustrated in FIG. 2C. An upper electrode voltage Vtop corresponds to the upper photoelectric conversion film 10 and a lower electrode voltage Vbottom corresponds to the lower photoelectric conversion film 11. Further, a power supply voltage VDD is a power supply voltage of a reset transistor 31 and a source follower transistor 32. Herein there are applied the upper electrode voltage Vtop and the lower electrode voltage Vbottom that are lower than the power supply voltage VDD. The source follower transistor 32 is connected to the signal line 34 via a pixel selection transistor 33. A current source 35 is connected to the signal line 34.

Processing

Figure 4:
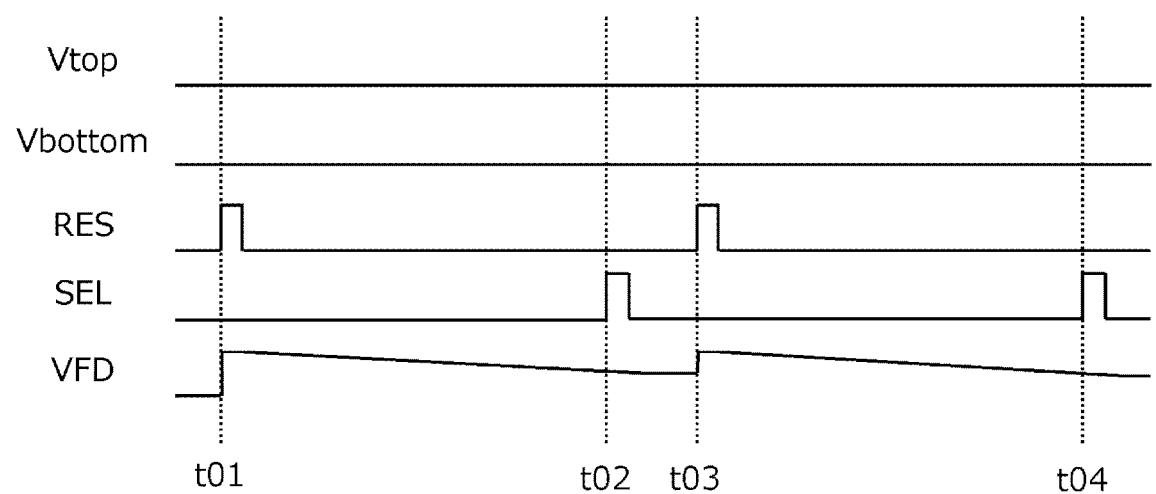
FIG. 4 is a drive timing chart of the first embodiment.

Pixel drive processing will be explained hereafter with reference to the timing chart of FIG. 4. Firstly, at timing t01, a reset pulse (RES pulse) inputted to the gate of the reset transistor is set to Hi. A floating diffusion 30 (hereafter, FD) becomes reset as a result. In consequence, a differential voltage of the upper electrode voltage Vtop and the power supply voltage VDD, and a differential voltage of the lower electrode voltage Vbottom and the power supply voltage VDD are applied to each photoelectric conversion film.

Thereafter, the RES pulse is set to Lo, as a result of which electrons generated by photoelectric conversion at each photoelectric conversion film become accumulated in the FD (VFD). Herein electrons generated in the two photoelectric conversion films are accumulated in the FD.

At timing t02, a selection pulse (SEL pulse) inputted to the gate of the pixel selection transistor 33 becomes Hi, whereby the source follower transistor 32 becomes connected to the signal line 34, and a source follower circuit becomes formed by the current source 35, the power supply voltage VDD and the source follower transistor 32. As a result, the source follower transistor 32 outputs to the signal line 34 a signal corresponding to the voltage of the FD, via the pixel selection transistor 33. Subsequently, the RES pulse similarly becomes Hi at timing t03, whereupon the FD is reset, and thereafter the accumulated charge is outputted on account of the SEL pulse at timing t04.

By adopting such a configuration it becomes possible to control independently the upper electrode voltage Vtop and the lower electrode voltage Vbottom, and as a result the voltage applied to the upper photoelectric conversion film 10 and the lower photoelectric conversion film 11 can be modified freely. The signals generated through photoelectric conversion at the respective photoelectric conversion films can therefore be separated.

An instance has been described above in which the signals from both photoelectric conversion films are read, but a configuration is also possible in which there is read only generated charge for either of the photoelectric conversion films. In that case, the value of voltage (Vtop or Vbottom) that is applied to the photoelectric conversion film for which generated charge is not to be read is set to be identical to the value of the power supply voltage VDD. In consequence, the voltage applied to the photoelectric conversion film is 0 V, and as a result the generated charge disappears through recombination, and is not accumulated in the FD.

The responsiveness of the films is modified thus by varying the values of the upper electrode voltage Vtop and the lower electrode voltage Vbottom. For instance to elicit avalanche multiplication at or above a given voltage in one of the photoelectric conversion films, control may be performed in two modes, below that given voltage and at or above that given voltage. In the present embodiment an instance has been explained in which electrons become accumulated in the FD through control of the magnitude relation between the upper electrode voltage Vtop, the lower electrode voltage Vbottom and the power supply voltage VDD. The same effect is however achieved in a case where holes are accumulated. In that case electron blocking layers are used instead of hole blocking layers. The transistors for pixel driving may be of n-type or of p-type.

In the configuration of FIG. 1 the upper electrode 100 and the pixel electrodes 102 lie at positions of blocking incident light on the lower photoelectric conversion film 11. Accordingly, a transparent material is preferably used in these electrodes. The term "transparent" does not necessarily require complete transmission of incident light. It suffices herein that at least the lower photoelectric conversion film can receive incident light of intensity that is meaningful in terms of the purpose of the imaging device. Preferably, also the pixel electrode insulating film 201 and the hole blocking layers similarly let light through. A transparent conductive material such as ITO can be used as the material of a high-transparency electrode.

Variation

Figure 5:
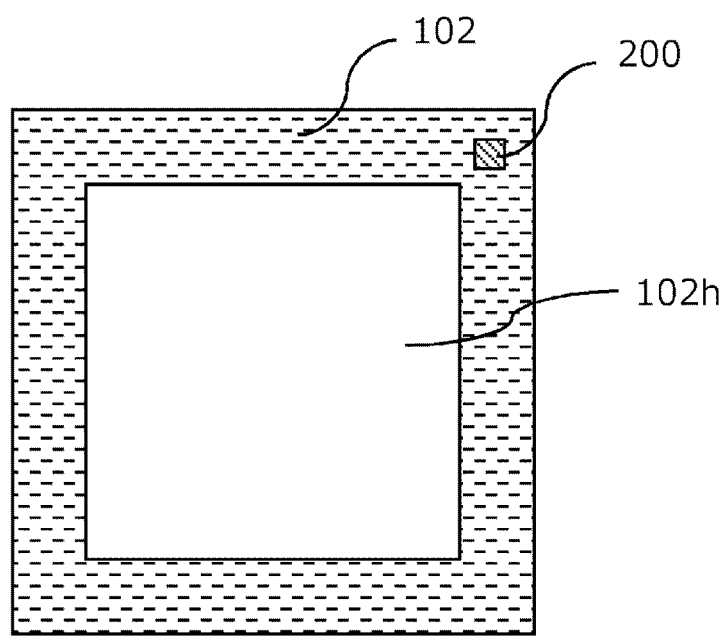
FIG. 5 is a plan-view diagram illustrating an example of a pixel electrode layer of the first embodiment.

In a case where a material of comparatively high light reflectance (for instance a metal) is used as the pixel electrodes 102, a respective opening 102h may be formed in part of each pixel electrode 102, as illustrated in FIG. 5. As a result it becomes possible to guide incident light up to the lower photoelectric conversion film 11. The opening 102h may be filled with a substance of high transparency (at least higher than that of a pixel electrode portion), in order to flatten the pixel electrode layer. Preferably, a microlens may be disposed in that case on the upper electrode, such that light is let through down to the lower photoelectric conversion film via the opening 102h.

The upper photoelectric conversion film 10 and the lower photoelectric conversion film 11 may have mutually different absorption wavelength bands. In that case, charge generated inside the photoelectric conversion films is combined and accumulated in the FD. This allows widening effectively the absorption wavelength band of the photoelectric conversion films.

The pixel electrode insulating film 201 is preferably provided from the viewpoint of flattening of the pixel electrode layer, but the pixel electrode insulating film 201 need not necessarily be provided if the pixel electrodes are electrically isolated from each other, and the upper photoelectric conversion film 10 and the lower photoelectric conversion film 11 can be separated from each other.

In addition to the function of isolating the contact vias 200 and the lower electrode 101 from each other, the contact via insulating film 202 has also the function of isolating the contact vias 200 and the lower photoelectric conversion film 11 from each other. The blocking effect of the lower hole blocking layer 12B is enhanced as a result.

A transfer transistor such as the one in the embodiment described below is not provided in the circuit of the present embodiment. Also in a circuit such as the one of the present embodiment, however, charge from one of the photoelectric conversion films alone can be accumulated by prescribing either the upper electrode voltage Vtop or the lower electrode voltage Vbottom to be higher than the power supply voltage VDD. The signals of the photoelectric conversion films can be separated from each other as a result.

Second Embodiment

Figure 6:
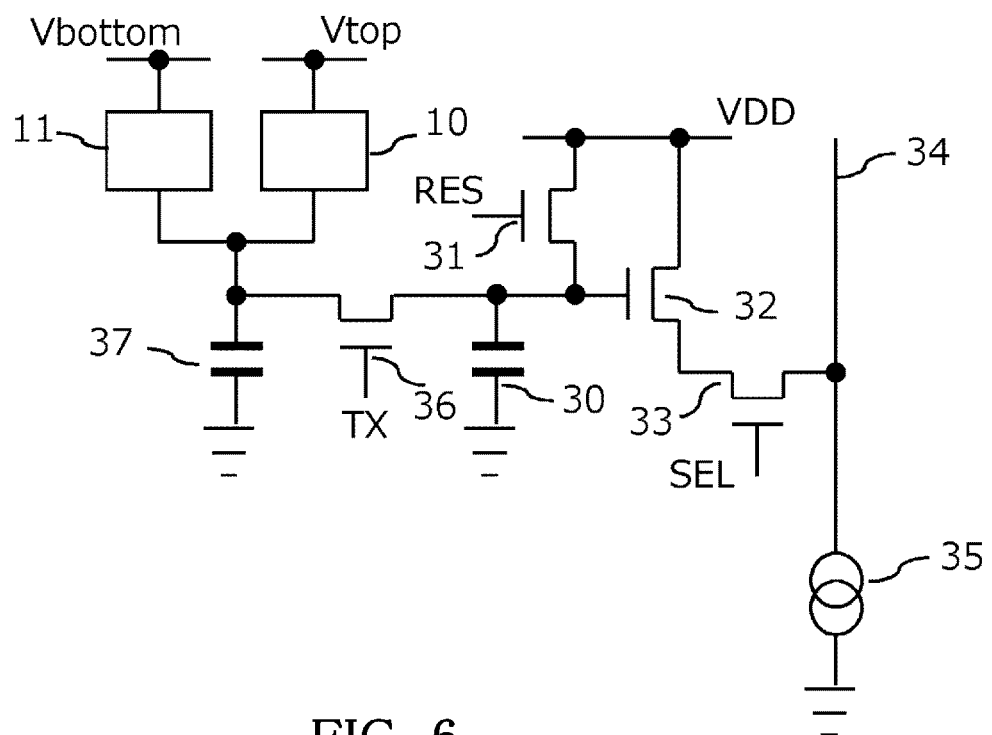
FIG. 6 is a circuit diagram of an imaging device in a second embodiment.

A second embodiment will be explained next focusing on portions that differ from the first embodiment. FIG. 6 is an equivalent circuit diagram of the present embodiment. In the present embodiment there are added a transfer transistor 36 and a memory capacitor 37.

Figure 7:
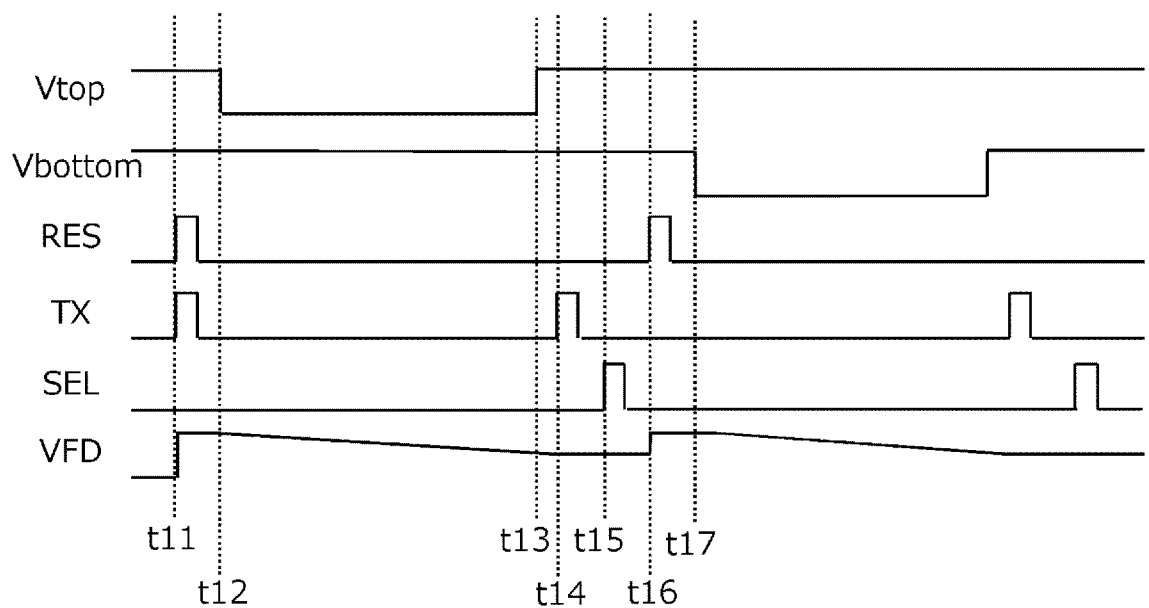
FIG. 7 is a drive timing chart of the second embodiment.

FIG. 7 is a timing chart of the present embodiment. At timing t11, a RES pulse and a transfer pulse (TX pulse) that are inputted to the gate of the transfer transistor are set to Hi. The memory capacitor and the FD are reset as a result. In this case the values of the upper electrode voltage Vtop and of the lower electrode voltage Vbottom are set to be substantially identical to the value of the power supply voltage VDD.

Thereafter, the RES pulse and the TX pulse are set to Low, and at timing t12 the voltage of the upper electrode voltage Vtop is lowered, to start thereby accumulation of charge in the upper photoelectric conversion film 10. Herein the value of the lower electrode voltage Vbottom is set to be still identical to the power supply voltage VDD. As a result only a signal derived from one of the photoelectric conversion films is accumulated in the memory capacitor 37. In the present figure the accumulation operation is initiated through control of the upper electrode voltage Vtop, but the accumulation operation may be controlled on the basis of the TX pulse and the RES pulse.

Next, at timing t13, the value of the upper electrode voltage Vtop is again set to be identical to that of the value of the power supply voltage VDD. From timing t13 onwards, electrons disappear within the film, and accordingly no signal is accumulated in the memory capacitor. This is a so-called global shutter operation. At timing t14, the TX pulse is set to Hi, whereby charge accumulated in the FD is transferred from the memory capacitor. Herein the voltage of the memory capacitor is returned to the potential at the time of reset, through complete character transfer. Some charge may however remain in the memory capacitor. Thereafter, the SEL pulse is set to Hi at timing t15, as a result of which the photoelectric conversion signal of the upper photoelectric conversion film 10 is outputted to the signal line.

At timing t16 the RES pulse is set to Hi, and only the FD is reset. Herein, the values of the upper electrode voltage Vtop and the lower electrode voltage Vbottom are identical to the value of the power supply voltage VDD, and accordingly no charge becomes accumulated in the memory capacitor. Next, at timing t17, the value of the lower electrode voltage Vbottom is reduced to be lower than the value of the power supply voltage VDD. As a result charge accumulation starts in the lower photoelectric conversion film 11. The operation henceforth is identical to that above.

The configuration and operation in the present embodiment allow reading independently signals derived from the upper photoelectric conversion film 10 and the lower photoelectric conversion film 11. In a case where absorption wavelength bands of the respective photoelectric conversion films are mutually different (for instance in a case where the upper photoelectric conversion film 10 has a visible light absorption characteristic and the lower photoelectric conversion film 11 has an infrared light absorption characteristic), it becomes therefore possible to separate and read signals of respective wavelength bands.

In conventional structures where photoelectric conversion films having different absorption wavelength bands are stacked and sandwiched collectively by two electrodes, separation of a visible light signal and an infrared light signal is accomplished through pixel signal subtraction. In such a method, however, noise components overlaid on the signal are also added at the time of signal reading, which translates into a drop in the S/N ratio of the signal. In the present embodiment, by contrast, the accumulation times can be completely separated from each other, and accordingly it becomes possible to separate a visible light signal and an infrared light signal, while reducing noise.

In the configuration of the present embodiment, the values of the upper electrode voltage Vtop and of the lower electrode voltage Vbottom may be controlled so that charge is accumulated in both the upper photoelectric conversion film 10 and the lower photoelectric conversion film 11. In that case a combined signal derived from both photoelectric conversion films is outputted from the pixels.

The upper photoelectric conversion film 10 and the lower photoelectric conversion film 11 in the present embodiment can be configured out of the same material. Specifically, the main element of the upper photoelectric conversion film 10 and the main element of the lower photoelectric conversion film 11 can be set to be identical. In that case the light absorption characteristics of the upper photoelectric conversion film 10 and of the lower photoelectric conversion film 11 are identical. Application examples such as those described below can be carried out also in such an implementation.

Application Example 1

In the configuration illustrated in FIG. 6, the lower electrode voltage Vbottom and the upper electrode voltage Vtop are controlled individually, as illustrated in FIG. 7. Specifically, an upper accumulation period during which the signal of the upper photoelectric conversion film 10 is accumulated in the memory capacitor and a lower accumulation period during which the signal of the lower photoelectric conversion film 11 is accumulated in the memory capacitor are set to be different from each other. The periods may be made different for instance in accordance with a mutually exclusion relationship therebetween, or in accordance with a relationship such that respective parts of the periods overlap each other, and other parts do not overlap each other. Specifically, it suffices to prescribe that a period being at least part of the upper accumulation period and a period being at least part of the lower accumulation period should not overlap each other.

As a result of this operation it becomes possible to provide a lower accumulation period, i.e. a period of signal accumulation by the lower photoelectric conversion film 11, in the period during which the source follower transistor 32 outputs a signal based on the signal of the upper photoelectric conversion film 10, to the signal line 34. A dead period in which the photoelectric conversion films have no sensitivity corresponding to incident light can be shortened thereby. The dead period can be brought to zero by providing the upper accumulation period and the lower accumulation period so as to be complementary to each other.

In a case where a dead period is present, for instance the motion of a moving body becomes discontinuous at the time of capture of a moving picture of the moving body, and as a result the viewer of the moving picture can readily perceive a drop in video image quality. In the case of monitoring cameras, an event of interest (behavior of a suspicious individual or suspicious vehicle at a given moment) may be missed, or the volume of information may be insufficient. Also, detection of objects (persons, vehicles or obstacles) that appear suddenly in front of the vehicle may be delayed in in-vehicle cameras that support vehicle driving. By shortening thus the dead period, as in the present application example, it becomes therefore possible to improve video image quality, to raise the probability of capture of an event of interest, and to increase object detection speed.

Application Example 2

Similarly to Application example 1, in the present application example as well the lower electrode voltage Vbottom and the upper electrode voltage Vtop are controlled individually, in the configuration illustrated in FIG. 6. Specifically, an upper accumulation period during which the signal of the upper photoelectric conversion film 10 is accumulated in the memory capacitor and a lower accumulation period during which the signal of the lower photoelectric conversion film 11 is accumulated in the memory capacitor are set to be different from each other. The periods may be set to be different such that the entirety of one from among the upper accumulation period and the lower accumulation period is included in the other accumulation period, or such that at least part of the other accumulation period is not included in the one accumulation period. Specifically, one from among the upper accumulation period and the lower accumulation period is set to be a short-time accumulation period, and the other accumulation period is set to be a long-time accumulation period. The entirety of the short-time accumulation period is included in the long-time accumulation period.

In image generation using a signal outputted by the imaging device, a signal generated in the long-time accumulation period is used in a case where the amount of light incident on the pixels is small. As a result it becomes possible to increase sensitivity in a case where the light quantity is small. By contrast, a signal generated in the short-time accumulation period is used in a case where the amount of incident light on the pixels is large. If the signal generated in the long-time accumulation period is hypothetically used in such a case, positions corresponding to pixels may exhibit white-out, and the gradation of the image be impaired, since the charge generated in the photoelectric conversion films is saturated. On the other hand, using a signal generated in the short-time accumulation period allows detecting the amount of incident light on the pixels, and accordingly it becomes possible to obtain brightness at the position corresponding to those pixels in the image. Impairment of image gradation can be suppressed as a result. That is, in the present application example there can be increased the dynamic range of the image utilizing the signal outputted by the imaging device.

Third Embodiment

Figure 8:
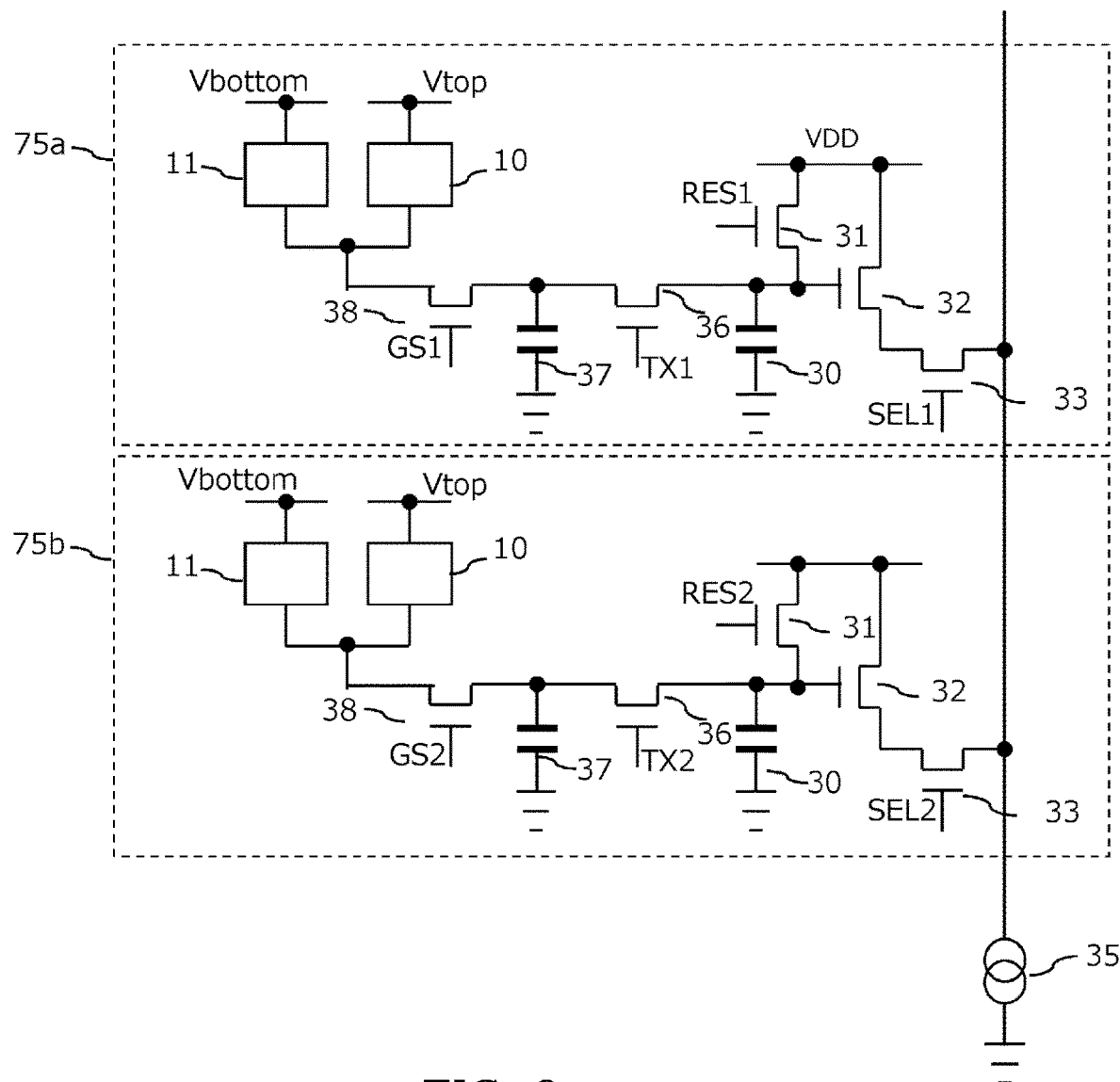
FIG. 8 is a circuit diagram of an imaging device in a third embodiment.

An explanation follows next on a third embodiment, focusing on differences with respect to the first and second embodiments. FIG. 8 is an equivalent circuit diagram of the present embodiment. Herein a GS (global shutter) transistor 38 is provided between the memory capacitor 37 and the photoelectric conversion films. Two pixels of identical configuration (first pixel 75a and second pixel 75b) are juxtaposed side by side. In the second embodiment a global shutter operation is performed through control of the upper electrode voltage Vtop and the lower electrode voltage Vbottom, but in the present embodiment the global shutter operation is performed by a reading circuit.

Figure 9:
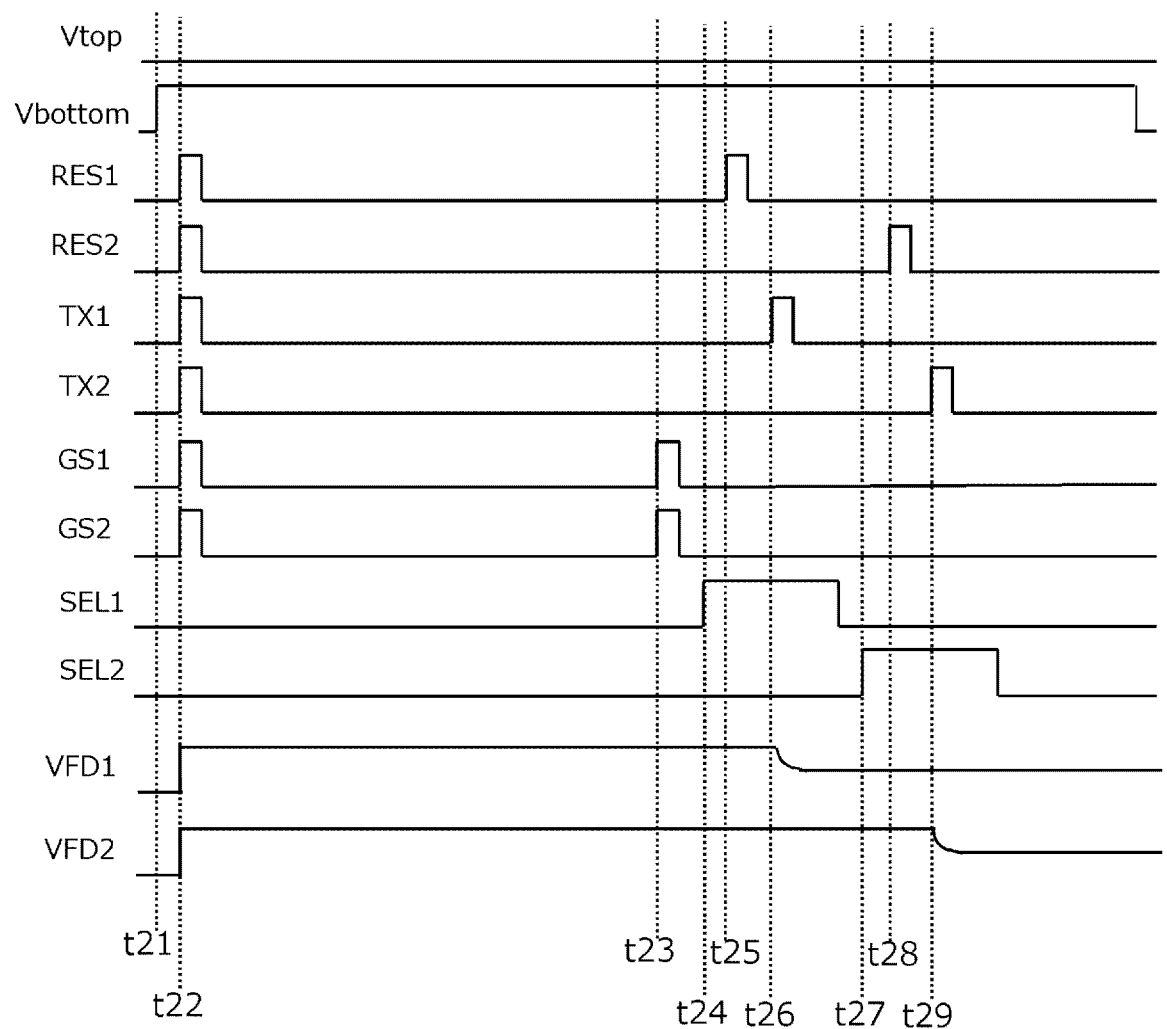
FIG. 9 is a drive timing chart of the third embodiment.

FIG. 9 is a timing chart illustrating driving in the present embodiment. At timing t21, a lower electrode voltage Vbottom shared by the pixels is raised. The upper electrode voltage Vtop shared by the pixels is in a low state, and accordingly charge can be accumulated in the upper photoelectric conversion film 10. A numeral will be suffixed hereafter to the names of pulses and so forth where the two pixels need to be distinguished from each other.

At timing t22, a GS pulse, a TX pulse and a RES pulse inputted to the gate of the GS transistor 38 are set to Hi simultaneously. Thereby the FD and the memory capacitor are reset, and in consequence VFD1 and VFD2 swing to the positive side. As described above, the upper electrode voltage Vtop is lower than the power supply voltage VDD, and as a result charge starts accumulating in the upper photoelectric conversion film 10. In this case, the charge accumulates in parasitic capacitance on the pixel electrode side of the GS transistor, but charge may also accumulate in a built-in capacitance.

At timing t23, the GS pulses are all set to Hi at the same time. Signals from the pixels are thereby transferred simultaneously to the memory capacitors. This is a so-called global shutter operation. Then from subsequent timing t24 onwards, signals are read (timings t26, t29) through sequential transfer of the signals from a memory electrode. A correlated double sampling (CDS) operation may be performed through a reset operation (timings t25, t28) in the FD prior to transfer. As a result there can be reduced noise caused by Vth variability in the source follower SF, and noise from signal superposition in the reading circuit.

The above flow allows realizing a global shutter operation pertaining to the upper photoelectric conversion film 10 of the pixels. Processing desired by the user may be performed thereafter. For instance, signals derived from light of different wavelength regions can be acquired by performing similar processing for the lower photoelectric conversion film 11. Also, imaging by the may upper photoelectric conversion film 10 be performed once again. Needless to say there may be acquired also a combined signal of both photoelectric conversion films. In the present embodiment, pixel signals derived from the upper photoelectric conversion film 10 and the lower photoelectric conversion film 11 can be acquired arbitrarily in a combined or separated manner, while achieving a reduction in noise.

In the present embodiment as well there can be performed the operation of Application example 1 and Application example 2 explained in the second embodiment.

Fourth Embodiment

Figure 10:
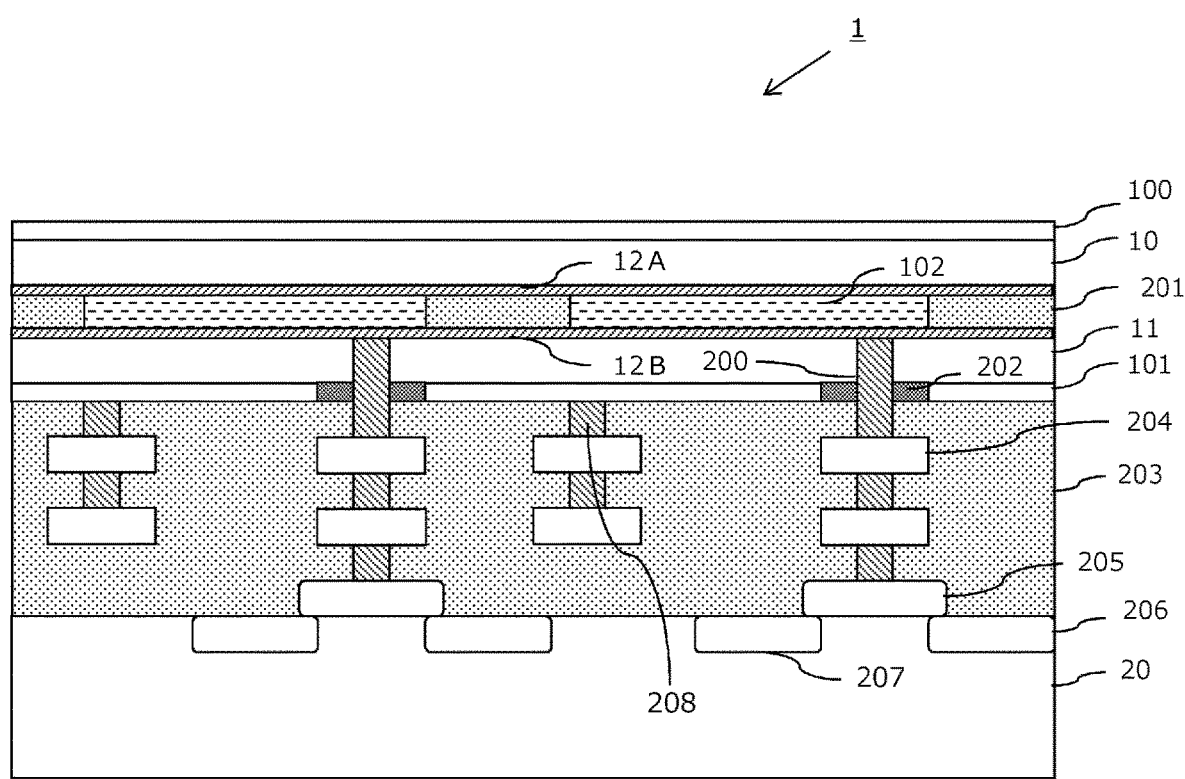
FIG. 10 is a cross-sectional structure diagram of an imaging device in a fourth embodiment.
Figure 11:
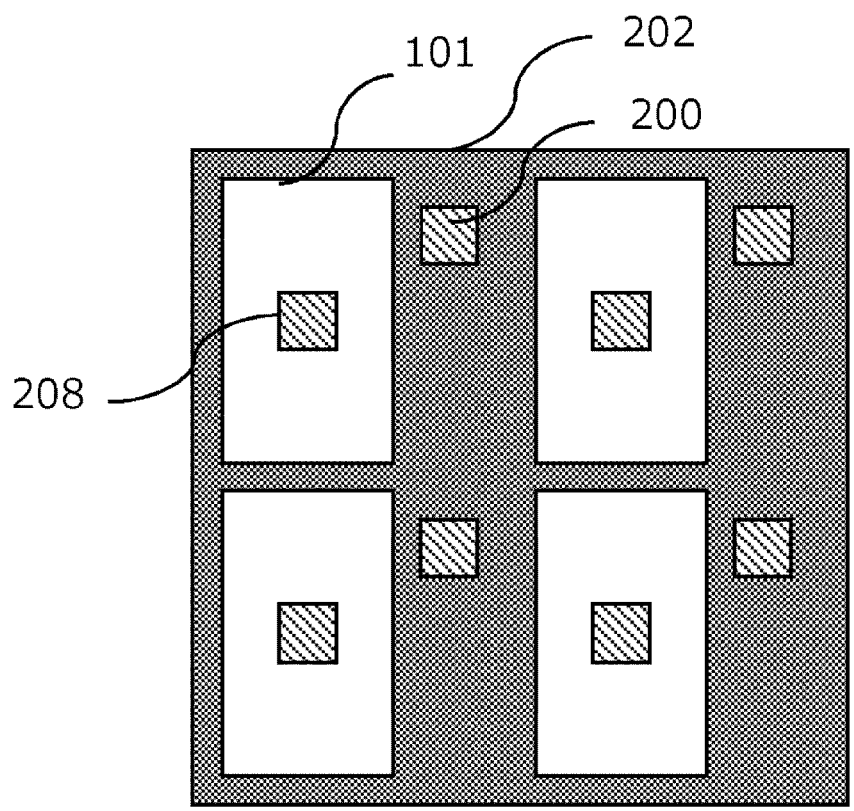
FIG. 11 is a plan-view diagram of a lower electrode layer of the imaging device in the fourth embodiment.

FIG. 10 illustrates a partial cross-sectional structure of a solid-state imaging element of the present embodiment. FIG. 11 is a plan-view diagram of a plane (lower electrode plane) that includes the lower electrode 101. Configurations identical to those of the above embodiments will be denoted with identical reference symbols, and an explanation thereof will be simplified. In the above embodiments the lower electrode 101 was shared by all the pixels. In the imaging device of the present embodiment, by contrast, the lower electrode 101 is provided independently for each pixel. Independently controllable lower electrode vias 208 are connected to respective lower electrodes.

In this configuration, the accumulation time at the lower electrodes can be modified for each pixel at the time of a global shutter operation, as in the second embodiment. A signal of short accumulation time and a signal of long accumulation time can be outputted as a result, and an HDR operation can be carried out by combining the outputted signals.

Fifth Embodiment

Figure 12A:
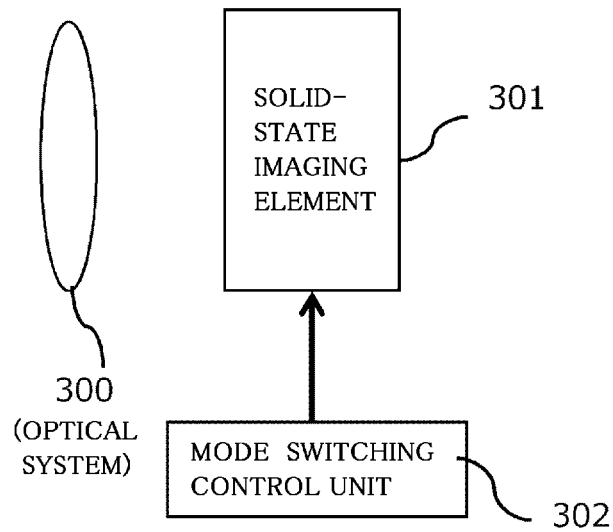
FIGS. 12A and 12B are respectively a schematic diagram of an imaging system and a process flow diagram of a fifth embodiment.
Figure 12B:
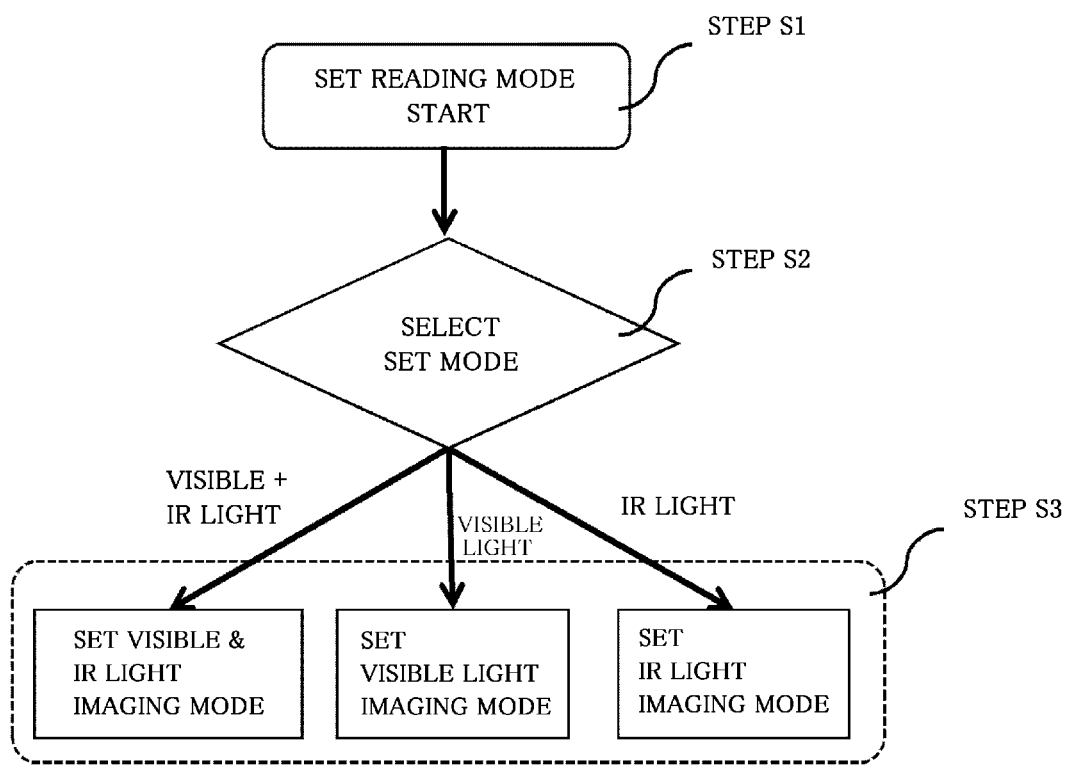

FIG. 12A illustrates an example of an imaging system having any of the solid-state imaging elements (imaging devices) of the above embodiments. FIG. 12B is a flow diagram illustrating processing in the present embodiment.

The imaging system of the present embodiment has a solid-state imaging element 301, an optical system 300 and a mode switching control unit 302. The mode switching control unit 302 establishes a mode in accordance with a program instruction or an input by the user via a user interface, and instructs mode switching to the solid-state imaging element 301. For instance, a configuration similar to those described above or an information processing device can be used herein as the mode switching control unit 302. The solid-state imaging element of the present embodiment is provided with two photoelectric conversion films having absorption characteristics for visible light and infrared light. A signal derived from visible light and a signal derived from infrared light can be acquired separately from each other, or can be acquired as a combination of the signals.

The flow diagram starts from the point in time where the device changes over to reading mode setting processing, as prompted by a program or by a user's instruction (step S1). Next, in step S2, the mode switching control unit 302 selects a setting mode from among "visible light+infrared light mode", "visible light mode" and "infrared light mode". Imaging in the desired mode is executed then in that the control circuit of the solid-state imaging element controls the values and control timings of the upper electrode voltage Vtop and the lower electrode voltage Vbottom, and the generation timings of various control pulses.

Sixth Embodiment

The present invention has been explained above on the basis of concrete embodiments, but the invention is not limited to the embodiments above, and various alterations and combinations can be made without departing from the object and scope of the present invention. Several application examples and variations of the present invention will be explained next.

Application Example in Imaging System

The imaging device according to the present invention can be used in an imaging system for capture of images in visible light or light of some other wavelength. Examples of imaging systems include for instance digital still cameras and digital camcorders.

Figure 13:
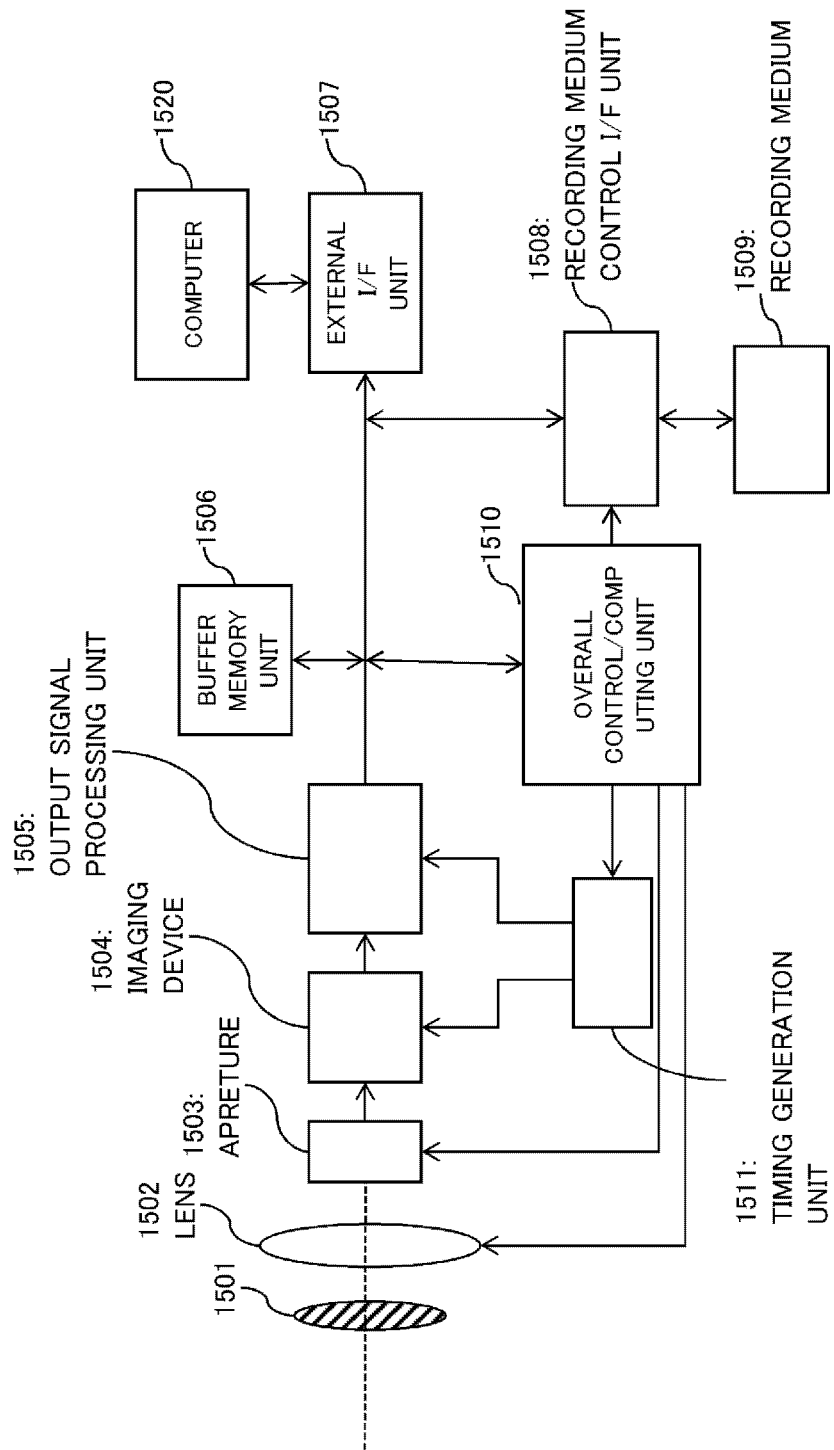
FIG. 13 is a schematic configuration diagram of an imaging system that utilizes an imaging device.

FIG. 13 is a schematic configuration diagram illustrating an example of such an imaging system. The imaging system has a barrier 1501 for protecting a lens, a lens 1502 that forms an optical image of an object on an imaging device 1504, and an aperture 1503 for varying the light quantity that passes through the lens 1502. The imaging system further has an output signal processing unit 1505 that processes the signal outputted by the imaging device 1504. An AD converter is formed on a substrate of the imaging device 1504. The signal outputted by the imaging device 1504 is an imaging signal for generating an image resulting from capturing the object. The output signal processing unit 1505 generates an image by subjecting the imaging signal outputted by the imaging device 1504 to various types of correction and compression, as needed. The lens 1502 and the aperture 1503 make up an optical system for condensing light onto the imaging device 1504.

The imaging system further has a buffer memory unit 1506 for temporary storage of image data, and an external interface unit 1507 for communication with an external computer (computer 1520) or the like. Further, the imaging system has a detachable recording medium 1509, such as a semiconductor memory, for recording or reading image data, and a recording medium control interface unit 1508 for recording or reading to/from the recording medium 1509. The further has an overall control/computing unit 1510 for controlling the various computations and the digital still camera as a whole. The imaging system further has a timing generation unit 1511 that outputs various timing signals for instance to the imaging device and the output signal processing unit. Herein for instance a timing signal may be inputted from outside the imaging system; alternatively, the imaging system may have at least an imaging device and an output signal processing unit for processing an imaging signal outputted by the imaging device.

The imaging device 1504 and the AD converter may or may not be formed on a same substrate. For instance, the imaging device 1504 and an AD converter that converts an analog signal outputted by the imaging device 1504 to a digital signal may be provided on separate substrates. As a concrete example, the output signal processing unit 1505, provided in a substrate separate from the substrate on which the imaging device 1504 is provided, has an AD converter. In the imaging system there may be stacked a semiconductor substrate on which the imaging device 1504 is provided, and a separate semiconductor substrate on which the output signal processing unit 1505 or the overall control/computing unit 1510 is provided.

The imaging device of the present invention can be used thus in an imaging system. Imaging (for instance with high-speed and low-noise effects) can be accomplished by using the imaging device of the present invention in an imaging system.

The output signal processing unit 1505 of the present embodiment is configured as described below in a case where the imaging device 1504 carries out the operation described as Application example 2 in the second embodiment. The output signal processing unit 1505, which is a signal processing unit, uses a signal of a first accumulation period (one from among the upper accumulation period and the lower accumulation period) corresponding to some of a plurality of pixels (i.e. some pixel electrodes a plurality of pixel electrodes), for generating an image. To generate the image, the output signal processing unit 1505 uses a second accumulation period (the other period from among the upper accumulation period and the lower accumulation period) corresponding to the other pixels (i.e. the other pixel electrodes of the plurality of pixel electrodes). The dynamic range of the image generated by the output signal processing unit 1505 can be increased as a result.

Application Example in Moving Body

Figure 14A:
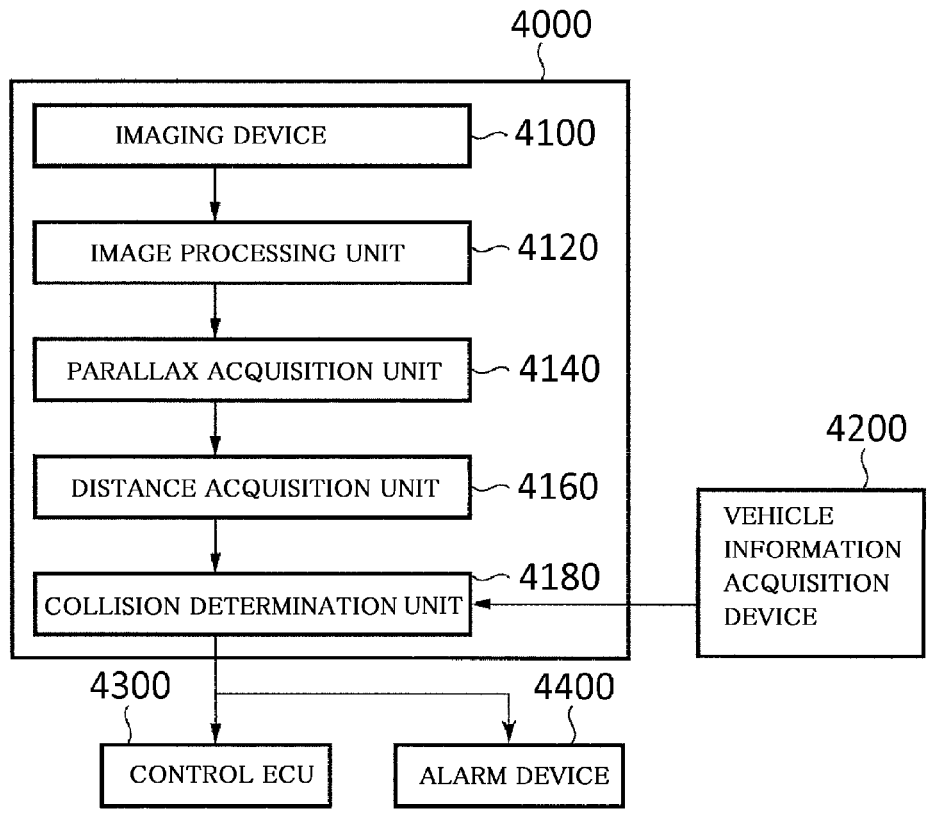
FIGS. 14A and 14B are diagrams respectively illustrating a system and a moving body that utilize an imaging device.
Figure 14B:
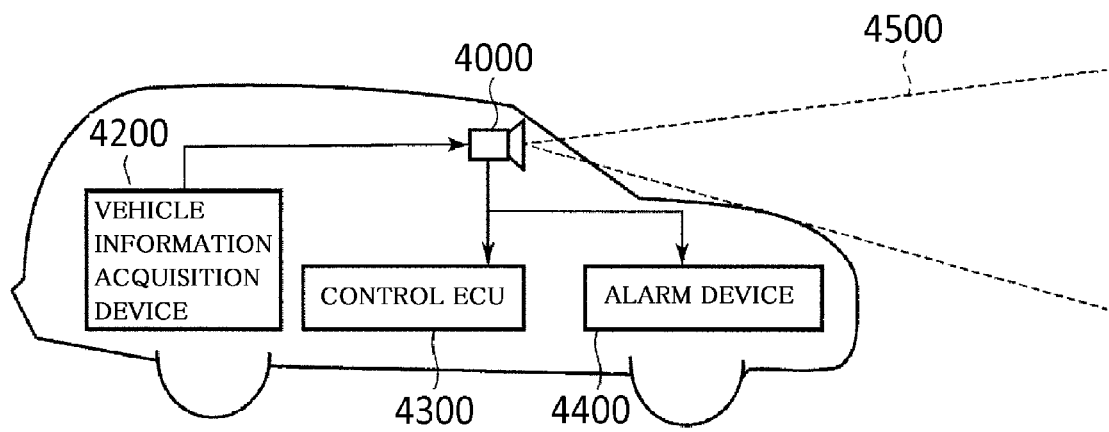

An imaging system and a moving body pertaining to an in-vehicle camera will be explained next with reference to FIGS. 14A and 14B. FIG. 14A illustrates an example of an imaging system 4000 pertaining to an in-vehicle camera. The imaging system 4000 has an imaging device 4100. The imaging device 4100 may be any of the imaging devices described above. The imaging system 4000 has an image processing unit 4120 being a processing device that performs image processing on a plurality of image data sets acquired by the imaging device 4100, and a parallax acquisition unit 4140 being a processing device that calculates parallax (phase difference in a parallax image) on the basis of the plurality of image data sets acquired by the imaging device 4100. The imaging system 4000 has a distance acquisition unit 4160 being a processing device that calculates the distance up to an object on the basis of the calculated parallax, and a collision determination unit 4180 being a processing device for determining whether a collision is possible or not, on the basis of the calculated distance. The parallax acquisition unit 4140 and the distance acquisition unit 4160 are examples of a distance information acquisition unit that acquires information such as distance information up to an object. Specifically, the distance information is information relating for instance to parallax, defocus amount or distance. The collision determination unit 4180 may determine the possibility of a collision using any one of these distance information items. The various processing device described above may be realized by specially designed dedicated hardware, or may be realized using general-purpose hardware for performing computations on the basis of a software module. The processing device may be realized for instance in the form of a field programmable gate array (FPGA) or an application specific integrated circuit (ASIC), or as a combination of the foregoing.

The imaging system 4000 is connected to a vehicle information acquisition device 4200, and can acquire vehicle information such as vehicle speed, yaw rate or steering angle. The imaging system 4000 has connected thereto a control ECU 4300 being a control device that outputs a control signal for eliciting generation of a braking force in the vehicle, on the basis of the determination result by the collision determination unit 4180. Specifically, the control ECU 4300 is an example of a moving body control unit that controls a moving body on the basis of distance information. The imaging system 4000 is also connected to an alarm device 4400 that issues a warning to a driver, on the basis of the determination result by the collision determination unit 4180. In the case for instance where there is a high possibility of collision, as a determination result of the collision determination unit 4180, the control ECU 4300 controls the vehicle so as to avoid collision and mitigate damage, for instance through braking, accelerator return and curtailment of engine output. The alarm device 4400 issues a warning to the user for instance by sounding an alarm, displaying alarm information on a screen of a car navigation system or the like and imparting vibration to a seat belt or the steering wheel.

In the present embodiment the surroundings of the vehicle, for instance frontward and rearward from the vehicle, are captured by the imaging system 4000. FIG. 14B illustrates the imaging system 4000 in an instance where the view ahead of the vehicle (imaging range 4500) is captured. The vehicle information acquisition device 4200 operates the imaging system 4000 and issues an instruction prompting the imaging system 4000 to perform imaging. The precision of distance measurement by the imaging system 4000 of the present embodiment can be increased through the use of the imaging devices in the above-described embodiments, as the imaging device 4100.

In the explanation above, examples have been described of control aimed at preventing collision with another vehicle, but the examples can also be applied for instance to self-driving control through tracking of another vehicle, or self-driving control so as to preclude leaving a given lane. The imaging system is not limited to automobiles, and can be used in moving bodies (transport equipment) such as vessels, aircraft and industrial robots. Moving devices in moving bodies (transport equipment) are various types of movement means such as engines, motors, wheels and propellers. The imaging system is not limited to moving bodies, and can for instance be used also in intelligent transportation systems (ITS), and units of equipment that rely extensively on object recognition.

The imaging device may be of front-surface irradiation type or of back-surface irradiation type. The imaging device may have a structure (chip multilayer structure) being a stack of a first semiconductor chip in which a plurality of photoelectric conversion units is provided, and a second semiconductor chip having peripheral circuits provided thereon. The peripheral circuits on the second semiconductor chip can be column circuits corresponding to pixel columns in the first semiconductor chip. The peripheral circuits in the second semiconductor chip can be matrix circuits corresponding to pixels or pixel blocks of the first semiconductor chip. Connection between the first semiconductor chip and the second semiconductor chip can be accomplished for instance through connection by through-electrodes (TSV), inter-chip wiring through direct bonding by a conductor such as copper, inter-chip connection by micro-bumps, or wire bonding. In a case where a chip multilayer structure is resorted to, the plurality of photoelectric conversion films and the pixel electrode layer sandwiched therebetween can be disposed on the first semiconductor chip, and can be disposed on the second semiconductor chip.

The present invention can also be utilized in various fields, for instance image sensors used in medical image acquisition devices, image sensors used in inspection devices of precision components, and image sensor used in monitoring cameras.

The present invention provides an imaging device that utilizes a plurality of stacked photoelectric conversion films, wherein respective signals generated by the plurality of photoelectric conversion films can be read individually.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™, a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-075187, filed Apr. 10, 2018, which is hereby incorporated by reference herein in its entirety.

What is claimed is:

1. An imaging device comprising:
a substrate;
a first electrode layer disposed on the substrate, and comprising a first electrode;
a first photoelectric conversion film disposed on the first electrode layer;
a pixel electrode layer disposed on the first photoelectric conversion film, and comprising a pixel electrode;
a second photoelectric conversion film disposed on the pixel electrode layer; and
a second electrode layer disposed on the second photoelectric conversion film, and comprising a second electrode,
wherein a part of the first photoelectric conversion film and a part of the second photoelectric conversion film are overlapped with each other in a plan view, and
wherein the pixel electrode collects (a) a signal charge converted at the first photoelectric conversion film and (b) a signal charge converted at the second photoelectric conversion film.

2. The imaging device according to claim 1, wherein the pixel electrode is connected to the substrate by way of a contact via that runs through the first electrode layer and the first photoelectric conversion film, and
wherein the imaging device further comprises an insulating film that insulates the first electrode layer from the contact via.

3. The imaging device according to claim 2, wherein the contact via is connected to a gate of a source follower transistor.

4. An imaging system comprising:
the imaging device according to claim 2; and
a signal processing unit that processes a signal outputted by the imaging device,
wherein the pixel electrode layer comprises a plurality of the pixel electrodes which are electrically isolated from each other, and
wherein the signal processing unit generates an image using a signal of the first accumulation period, which corresponds to some pixel electrodes of the plurality of pixel electrodes, and a signal of the second accumulation period, which corresponds to some other pixel electrodes of the plurality of pixel electrodes.

5. The imaging device according to claim 1, wherein the pixel electrode is connected to the first photoelectric conversion film along with the first electrode, and is connected to the second photoelectric conversion film along with the second electrode.

6. The imaging device according to claim 5, wherein voltage applied by the first electrode to the first photoelectric conversion film and voltage applied by the second electrode to the second photoelectric conversion film can be controlled independently.

7. The imaging device according to claim 1, wherein a main element of the first photoelectric conversion film and a main element of the second photoelectric conversion film are different from each other.

8. The imaging device according to claim 1, wherein absorption wavelength bands of the first photoelectric conversion film and of the second photoelectric conversion film are different from each other.

9. The imaging device according to claim 8, wherein one from among the first photoelectric conversion film and the second photoelectric conversion film has a main absorption characteristic in visible light, and the other has a main absorption characteristic in infrared light.

10. The imaging device according to claim 1, wherein a main element of the first photoelectric conversion film and a main element of the second photoelectric conversion film are identical.

11. The imaging device according to claim 10, wherein absorption wavelength bands of the first photoelectric conversion film and of the second photoelectric conversion film are identical.

12. The imaging device according to claim 1, wherein the pixel electrode layer comprises a plurality of the pixel electrodes which are electrically isolated from each other.

13. The imaging device according to claim 12, wherein the first electrode layer comprises a plurality of the first electrodes corresponding to the plurality of pixel electrodes.

14. The imaging device according to claim 1, wherein an opening is provided in the pixel electrode included in the pixel electrode layer.

15. An imaging system comprising:
the imaging device according to claim 1; and
a signal processing unit that processes a signal outputted by the imaging device.

16. A moving body comprising:
the imaging device according to claim 1;
a distance information acquisition unit that acquires information about distance up to an object, using a pixel signal outputted by the imaging device; and
a moving body control unit that controls the moving body on the basis of the distance information.

17. An imaging device comprising:
a substrate;
a first electrode layer disposed on the substrate, and comprising a first electrode;
a first photoelectric conversion film disposed on the first electrode layer;
a pixel electrode layer disposed on the first photoelectric conversion film, and comprising a pixel electrode;
a second photoelectric conversion film disposed on the pixel electrode layer;
a second electrode layer disposed on the second photoelectric conversion film, and comprising a second electrode; and
a floating diffusion,
wherein a part of the first photoelectric conversion film and a part of the second photoelectric conversion film are overlapped with each other in a plan view, and
wherein a signal charge converted at the first photoelectric conversion film is input to the floating diffusion, which receives a signal charge converted at the second photoelectric conversion film.

18. The imaging device according to claim 17, wherein the pixel electrode is connected to the first photoelectric conversion film along with the first electrode, and is connected to the second photoelectric conversion film along with the second electrode.

19. The imaging device according to claim 18, wherein voltage applied by the first electrode to the first photoelectric conversion film and voltage applied by the second electrode to the second photoelectric conversion film can be controlled independently.

20. The imaging device according to claim 17, wherein an opening is provided in the pixel electrode included in the pixel electrode layer.

21. The imaging device according to claim 17, wherein the pixel electrode is connected to the substrate by way of a contact via that runs through the first electrode layer and the first photoelectric conversion film, and
wherein the imaging device further comprises an insulating film that insulates the first electrode layer from the contact via.

22. An imaging system comprising:
the imaging device according to claim 17; and
a signal processing unit that processes a signal outputted by the imaging device.

23. A moving body comprising:
the imaging device according to claim 17;
a distance information acquisition unit that acquires information about distance up to an object, using a pixel signal outputted by the imaging device; and
a moving body control unit that controls the moving body on the basis of the distance information.

* * * * *